(12) United States Patent
Takaoka

(10) Patent No.: US 8,772,692 B2
(45) Date of Patent: Jul. 8, 2014

(54) OPTICAL TRANSMISSION DEVICE, LASER MODULE, FAILURE DETECTION METHOD FOR LASER MODULE, AND FAILURE DETECTION PROGRAM FOR LASER MODULE

(75) Inventor: Masaaki Takaoka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 398 days.

(21) Appl. No.: 13/035,089

(22) Filed: Feb. 25, 2011

(65) Prior Publication Data

US 2011/0220779 A1 Sep. 15, 2011

(30) Foreign Application Priority Data

Mar. 15, 2010 (JP) ................................. 2010-058464

(51) Int. Cl.
*H01J 40/14* (2006.01)

(52) U.S. Cl.
USPC ........................................... 250/205; 385/88

(58) Field of Classification Search
USPC ................. 250/205, 227, 239; 385/14, 88–94
See application file for complete search history.

(56) References Cited

U.S. PATENT DOCUMENTS

| 5,611,006 A | 3/1997 | Tabuchi |
| 6,758,607 B2 * | 7/2004 | Nakabayashi et al. .......... 385/88 |

FOREIGN PATENT DOCUMENTS

| JP | 61-016637 | 1/1986 |
| JP | 01-133759 U | 9/1989 |
| JP | 7-74343 A | 3/1995 |
| JP | 2009-229082 | 10/2009 |

OTHER PUBLICATIONS

JPOA—Office Action of Japanese Patent Application No. 2010-058464 dated Apr. 1, 2014 with Partial Translation.

* cited by examiner

*Primary Examiner* — Seung C Sohn
(74) *Attorney, Agent, or Firm* — Fujitsu Patent Center

(57) ABSTRACT

An optical transmission device capable of being coupled to an optical fiber includes a light source configured to emit a first light toward the optical fiber; a lens configured to converge the first light to an end of the optical fiber; a light reflector configured to reflect a first reflected light as a second reflected light, a part of the first light being reflected as the first reflected light by the lens or the optical fiber; a first light receiver configured to receive the second reflected light; a detector configured to detect a failure based on a difference value between a first value corresponding to an amount of the second reflected light and a reference value being indicative of an amount of the second reflected light, the second reflected light being detected when the first light is normally emitted and is normally transmitted to and through the optical fiber.

16 Claims, 14 Drawing Sheets

| REF. VALUE | -27dBm |
|---|---|
| MONITORED VALUE OF REARWARD EMITTED LIGHT | -20dBm |
| FAILURE DETECTION THRESHOLD VALUE | ±5dBm |

OPTICAL TRANSMISSION DEVICE, LASER MODULE, FAILURE DETECTION METHOD FOR LASER MODULE, AND FAILURE DETECTION PROGRAM FOR LASER MODULE

CROSS-REFERENCE TO RELATED APPLICATION

This application is based upon and claims the benefit of priority of the prior Japanese Patent Application No. 2010-058464, filed on Mar. 15, 2010, the entire contents of which are incorporated herein by reference.

FIELD

The embodiments discussed herein are related to an optical transmission device, a laser module, a failure detection method for a laser module, and a failure detection program for a laser module.

BACKGROUND

It is known that a laser module used for an optical transmission device or the like, has included a photodiode in the rear of a laser diode as a light source. For monitoring power output from the laser diode, optical power output to rearward of the laser diode is monitored by the photodiode. FIG. 15 is a diagram illustrating an example of the configuration of a laser module of the related art.

As illustrated in FIG. 15, a laser module 100 includes a laser diode (LD) 110, a lens 120, an isolator 130, a lens 140, a ferrule 150, and a photo diode (PD) 160, and is jointed to an optical fiber 200. The laser diode 110 emits laser light which is focused by the lens 120. The focused laser light then enter the isolator 130 which blocks laser light propagating in a direction different from a propagating direction from the lens 120 to the lens 140.

The laser light focused by the lens 120 enters the lens 140 to be further focused. The further focused laser light enters an optical fiber 200 which is joined to the laser module 100 via the ferrule 150. As described above, in the rear of the laser diode 110 the photo diode 160 is provided to receive the laser light emitted from the laser diode 110 in the opposite direction from the lens 120. In this manner, the output of the laser diode 110 is monitored by monitoring the laser light received by the photo diode 160 in the laser module of the related art.

In addition, there has been known an optical transmission device in which an optical coupler is disposed in front of a laser module. In the optical transmission device, a part of laser light emitted from the laser module is branched in the optical coupler. The optical transmission device monitors the output of the laser module by monitoring the optical power of the branched laser light. FIG. 16 is a diagram illustrating an example of an optical transmission device of the related art.

As illustrated in FIG. 16, an optical transmission device 2000 includes a laser module 100, an optical coupler 300, and a photo diode 400. The optical coupler 300 branches laser light emitted from the laser module 100 into main signal light and monitoring light. The monitoring light is received by the photo diode 400. In the optical transmission device 2000 of the related art, the output of the laser module 100 is monitored by monitoring the laser light received by the photo diode 400.

An example of techniques of the related art is disclosed in Japanese Laid-open Patent Publication No. 07-74343.

SUMMARY

According to an aspect of the invention, an optical transmission device capable of being coupled to an optical fiber includes a light source, a lens, a light reflector, a first light receiver, and a detector.

The light source is configured to emit a first light toward the optical fiber and the lens is configured to converge the first light to an end of the optical fiber. The light reflector is configured to reflect a first reflected light as a second reflected light, where a part of the first light is reflected as the first reflected light by the lens or the optical fiber. The first light receiver is configured to receive the second reflected light and the detector is configured to detect a failure based on a difference value between a first value corresponding to an amount of the second reflected light and a reference value being indicative of an amount of the second reflected light, where the second reflected light is detected when the first light is normally generated and is normally transmitted to and through the optical fiber.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

The technique described above for monitoring the optical power output to reward of a laser diode, there has been a problem that it is difficult to detect the malfunction in a range from the laser diode to the optical fiber or the disconnection of an optical fiber. It is because the monitoring may detect only output abnormality of the laser diode.

In the technique in which the optical power of laser light branched by an optical coupler is monitored, just the output abnormality of the laser module is detected. Therefore, it is difficult to determine whether the laser diode is degraded or a malfunction occurs in the range and to detect a malfunction that occurs when the disconnection of the optical fiber occurs.

The details of the embodiments of an optical transmission device, a laser module, a failure detection method for a laser module, and a failure detection program for a laser module will be described with reference to attached figures, hereinafter. In addition, the optical transmission device, the laser module, the failure detection method for the laser module, and the failure detection program for the laser module, disclosed in the present application, are not limited to the embodiments described hereinafter.

[First Embodiment]

Figure 1:
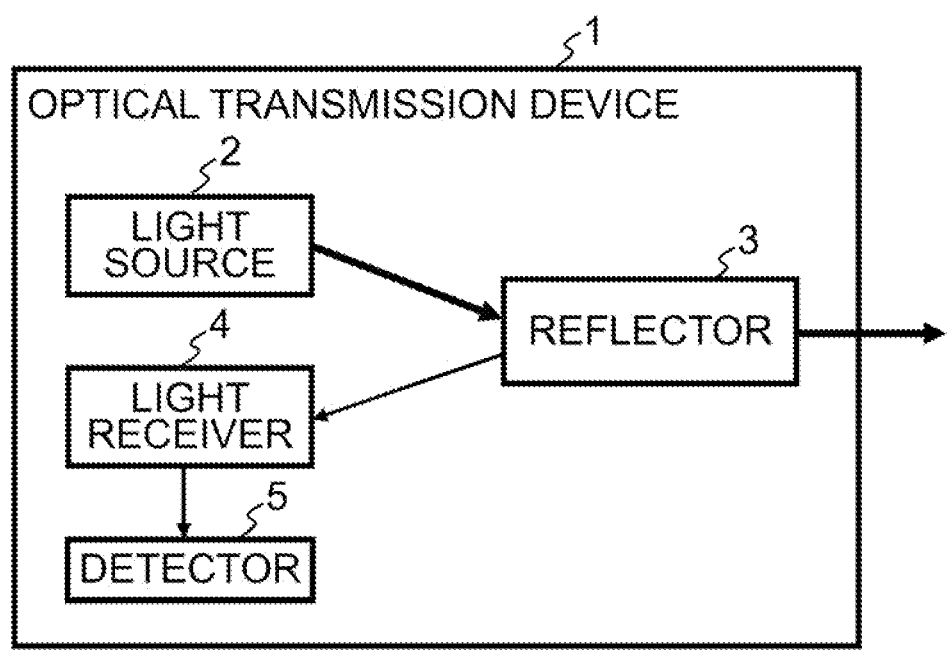
FIG. 1 is a diagram illustrating a configuration of an optical transmission device according to a first embodiment.

The configuration of an optical transmission device according to a first embodiment will be described. FIG. 1 is a diagram illustrating the configuration of an optical transmission device according to the first embodiment. As illustrated in FIG. 1, an optical transmission device 1 includes an optical source 2, a reflector 3, a photo receiver 4, and a detector 5, and executes a failure detection processing operation using laser light emitted from the optical transmission device 1.

The optical source 2 emits light toward an optical fiber which is optically connected to the optical transmission device 1. The reflector 3 reflects a part of light emitted from the optical source 2, using the end face of the optical fiber, the polishing angle of which is adjusted, or a focusing lens coated with an antireflection film of which a reflectance is adjusted. The photo receiver 4 receives reflected light reflected from the direction of the optical fiber. The detector 5 detects a failure based on a difference between a value indicating reflected light received by the photo receiver 4 and a reference value or a reference value indicating light thought to be reflected by the reflector 3 when the optical transmission device 1 normally functions.

As described above, in the optical transmission device 1 according to the first embodiment, a part of the laser light is reflected at the optical fiber end face or the lens, and then the reflected light reflected from the direction of the optical fiber is compared with reflected light occurring at the time of a normal operation. Accordingly, in the optical transmission device 1 according to the first embodiment, the decrease of reflected light due to the misalignment of a portion used for jointing the optical fiber or the misalignment of a lens can be detected. In addition, in the optical transmission device 1 according to the first embodiment, the increase of reflected light due to the disconnection of the optical fiber can be detected. Namely, in the optical transmission device 1 according to the first embodiment, the malfunction of the optical output system and the disconnection of the optical fiber can be detected.

[Second Embodiment]

First, in a second embodiment, a laser module according to the second embodiment will be described. After that, an optical transmission device according to the second embodiment will be described.

[Configuration of Laser Module According to Second Embodiment]

Figure 2:
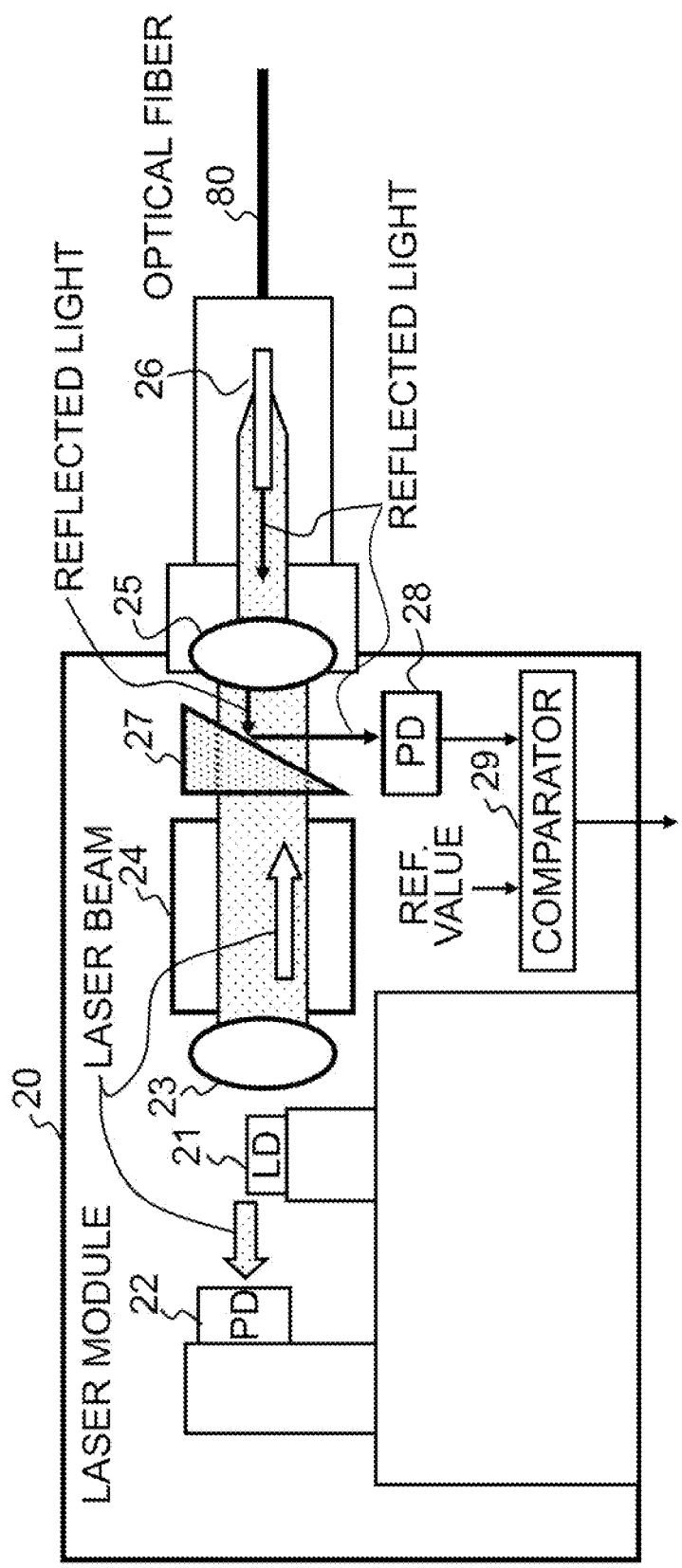
FIG. 2 is a diagram illustrating a configuration of a laser module according to a second embodiment.

First, the configuration of the laser module according to the second embodiment will be described. FIG. 2 is a diagram illustrating the configuration of a laser module 20 according to the second embodiment. As illustrated in FIG. 2, the laser module 20 includes a laser diode 21, a photo diode 22, a lens 23, an isolator 24, a lens 25, a ferrule 26, and a prism 27. The laser module 20 further includes a photo diode 28 and a comparator 29, and is jointed to an optical fiber 80.

The optical fiber 80 is an optical fiber for transmitting laser light output from the laser module 20. The laser diode 21 outputs the laser light in the direction of the optical fiber 80. The photo diode 22 receives the laser light output from the laser diode 21 in the opposite direction from the optical fiber 80.

The lens 23 focuses the laser light output by the laser diode 21 in the direction of the optical fiber 80. The isolator 24 is an element that transmits the laser light output by the laser diode 21 in one direction. Specifically, the isolator 24 only transmits the laser light traveling in the direction from the lens 23 to the optical fiber 80.

The lens 25 focuses the laser light entering through the isolator 24, and reflects a part of the laser light. Here, a process to which the lens 25 is subjected to reflect the laser light will be described. Usually, a lens included in an optical transmission device is applied with an anti reflect (AR) coating as an antireflection film. For example, the AR coating is a thin film on which $MgF_2$ or the like is vapor-deposited. Since light reflected from the surface of the thin film and light reflected after transmitting through the thin film are interfered with each other, a resultant reflection is increased.

The lens 25 is made so that a very small amount of laser light is reflected from the lens 25 by the AR coating. The intensity of the reflected amount of laser light is for example about −30 dBm which does not affect signal light.

The ferrule 26 is a joint member between the laser module 20 and the optical fiber 80. The end face of the optical fiber 80 jointed to the laser module 20 by the ferrule 26 will be described. The end face of the optical fiber 80 is polished at an angle so as to reflect a part of the laser light. The angle is different from that which is usually for improving the incidence efficiency of the laser light to the optical fiber.

Figure 3:
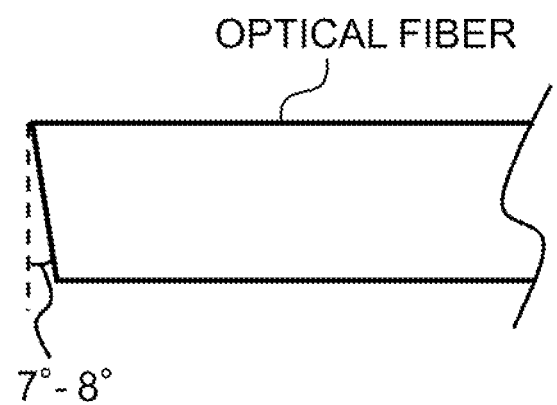
FIG. 3 is a diagram illustrating an end face of an optical fiber of the related art.

FIG. 3 is a diagram illustrating the end face of an optical fiber of the related art. As illustrated in FIG. 3, the usual end face of an optical fiber is polished at an angle ranging from 7° to 8° for improving the incidence efficiency, while the end face of the optical fiber 80 jointed by the ferrule 26 is polished at an angle different from the angle ranging from 7° to 8°. For example, the end face of the optical fiber 80 is polished at such an angle that light is reflected the intensity about −30 dBm of which the reflected laser light does not affect signal light.

Returning to FIG. 2, the prism 27 changes the direction of reflected light reflected from the direction of the optical fiber 80, to the direction of the photo diode 28 described later. Accordingly, the photo diode 28 may receive the reflected light reflected from the direction of the optical fiber. Then the photo diode 28 receives the reflected light and converts the reflected light to a current of which value may be used as a value indicating the reflected light.

The comparator 29 detects a failure based on a difference between the current value and a reference value indicating light thought to be reflected when the laser module 20 normally functions. Due to the difference, the comparator 29 changes over an output and sends the output to an output destination not illustrated in FIG. 2. An example of the difference indicates whether the current value increases or decreases compared with the reference value.

The reference value is a current value corresponding to sum of lights at a normal operation of the laser module 20. One is the reflected light reflected by the lens 25 and the other is the reflected light reflected from the end face of the optical fiber 80. The reference value is preliminarily set by the designer of a laser module.

Namely, the laser module 20 according to the second embodiment detects a failure by determining whether or not reflected light currently reflected from the direction of the optical fiber 80 varies compared with the reflected light in the normal operation. For example, the reflected light reflected from the direction of the optical fiber 80 decreases due to the position misalignment of the lens 25 or of a focal point of the laser light entering into the optical fiber 80 owing to a mechanical stress or the like. Conversely, the reflected light reflected from the direction of the optical fiber 80 increases when the disconnection of the optical fiber 80 occurs, since the disconnection causes the total reflection of the laser light at a disconnected portion.

Accordingly, depending upon whether a malfunction occurs in the optical system such as the lens 25, the ferrule 26, and the like or the optical fiber 80 is disconnected, the comparator 29 changes over the output. Namely, the operator of the laser module 20 according to the second embodiment may detect the malfunction of the optical system in the laser module 20 and the disconnection of the optical fiber 80, by monitoring the output of the comparator 29.

[Configuration of Optical Transmission Device According to Second Embodiment]

Figure 4:
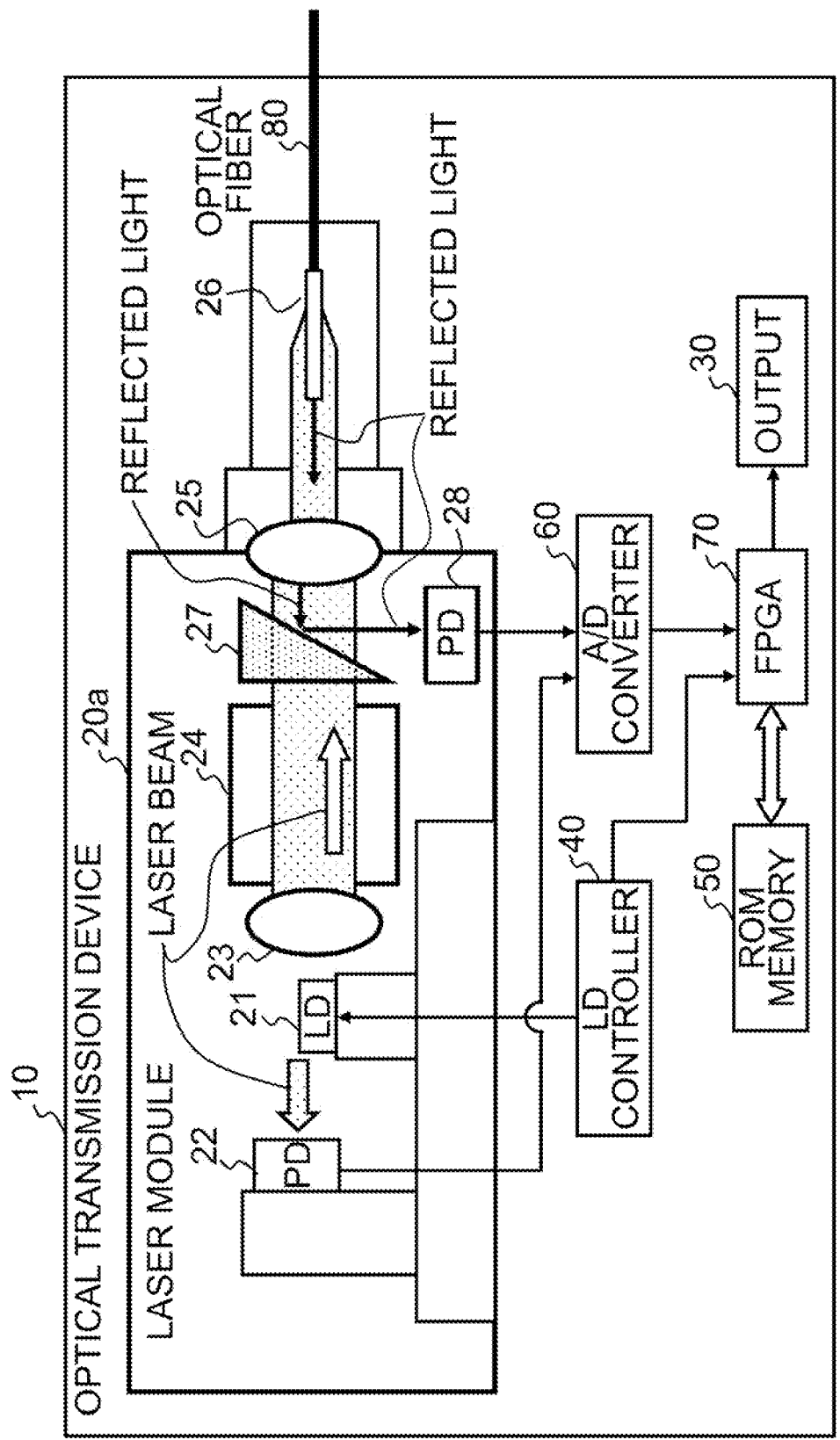
FIG. 4 is a diagram illustrating a configuration of an optical transmission device according to the second embodiment.

The configuration of an optical transmission device 10 according to the second embodiment will be described with reference to FIG. 4. In FIG. 4, the same symbol is assigned to the same configuration element as that in the laser module 20 according to the second embodiment, and the description of the same processing operation as that in the laser module 20 according to the second embodiment will be omitted.

As illustrated in FIG. 4, the optical transmission device 10 includes a laser module 20a, an output device 30, a laser diode controller 40, a ROM memory 50, an analog to digital (A/D) converter 60 and a field programmable gate array (FPGA) 70, and is jointed to the optical fiber 80.

The output device 30 such as a speaker outputs information. The laser diode controller 40 is coupled with the laser diode 21 to control the output of laser light at a desired output level. The ROM memory 50 stores a reference value indicating reflected light thought to be reflected when the optical transmission device 10 normally functions. Specifically, the ROM memory 50 stores a value indicating reflected light into which the reflected light reflected by the lens 25 at the normal operation is combined with the reflected light reflected from the end face of the optical fiber 80 jointed by the ferrule 26.

The ROM memory 50 further stores a value indicating laser light output from the laser diode 21 in the opposite direction from the optical fiber 80, where the laser light is received by the photo diode 22. Still further, the ROM memory 50 stores a threshold value used for detection of failure by the FPGA 70 described later. Data of these values are illustrated in a diagram of FIG. 5.

Figures 5, 6:
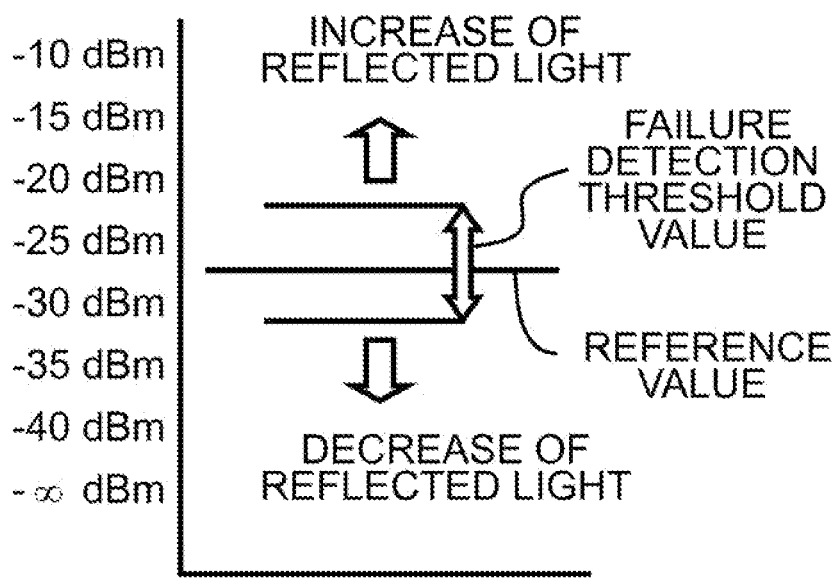
FIG. 5 is a diagram illustrating data stored in a ROM memory according to the second embodiment.
FIG. 6 is a diagram illustrating an FPGA according to the second embodiment.

An "reference value" illustrated in FIG. 5 means the value indicating reflected light into which the reflected light reflected by the lens 25 at the normal operation is combined with the reflected light reflected from the end face of the optical fiber 80 jointed by the ferrule 26. A "back monitor value" means a value indicating laser light output from the laser diode 21 in the opposite direction from the optical fiber 80. In addition, a "failure detection threshold value" means a threshold value that the FPGA 70 uses for failure detection. For example, as illustrated in FIG. 5, the ROM memory 50 stores "the reference value: −27 dBm, the back monitor value: −20 dBm, and the failure detection threshold value: ±5 dBm". In addition, the "reference value", the "back monitor value", and the "failure detection threshold value", illustrated in FIG. 5, may be set by the operator.

The laser lights received by the photodiodes 22 and 28 are converted into respective currents. The respective currents are converted into respective digital signals by the A/D converter 60.

The reference value stored in the ROM memory 50 is updated to a current reference value acquired by the FPGA 70 when the optical transmission device 10 is started up. In a similar way, updating the reference value is performed when the output level of the light emitted from the laser diode 21 is changed to another one by the laser diode controller 40.

Further updating the reference value is also performed in a similar way when the output level of the laser light received by the photo diode 22 varies. The variation is detected by resultant disagreement between the value indicating the laser light received by the photo diode 22 and the back monitor value stored in the ROM 50, where the resultant disagreement is obtained by comparing these two values by the FPGA 70

For example, when the value indicating the laser light received by the laser diode 22 is different from the "back monitor value: −20 dBm" illustrated in FIG. 5, the FPGA 70 makes the ROM memory 50 store as a current reference value a value indicting the reflected light received by the photo diode 28 instead of the reference value having been stored in the ROM memory 50.

The FPGA 70 detects a failure based on a difference between a value indicating reflected light received by the photo diode 28 and a reference value, which stored in the ROM memory 50, indicating light thought to be reflected when the optical transmission device 10 normally functions.

Further, the FPGA 70 determines that the optical fiber is disconnected when the value indicating reflected light exceeds the reference value and the difference between these two values is larger than a predetermined threshold value. Inversely, the FPGA 70 determines that a malfunction occurs in the optical output system relating to the output of light to the optical fiber when the value indicating reflected light falls below the reference value and the difference between these two values is larger than a predetermined threshold value.

Specifically, when, compared with the reference value, the value indicating reflected light received by the photo diode 28 increases with exceeding the failure detection threshold value stored in the ROM memory 50, the FPGA 70 determines that the optical fiber is disconnected. In addition, when, compared with the reference value, the value indicating reflected light received by the photo diode 28 decreases with exceeding the failure detection threshold value stored in the ROM memory 50, the FPGA 70 determines that a malfunction occurs in the optical output system such as the lens 25, the ferrule 26, or the like.

FIG. 6 is a diagram illustrating the FPGA 70 according to the second embodiment. In FIG. 6, a vertical axis indicates a value of the reflected light, and the horizontal axis indicates a time axis. In addition, a "reference value" illustrated in FIG. 6 means a value indicating reflected light into which the reflected light reflected by the lens 25 at the normal operation is combined with the reflected light reflected from the end face of the optical fiber 80 jointed by the ferrule 26. In addition, a "failure detection threshold value" illustrated in FIG. 6 means a threshold value that the FPGA 70 uses for failure determination.

As illustrated in FIG. 6, when, compared with the reference value, the value indicating reflected light increases with the increase thereof exceeding the failure detection threshold value, the FPGA 70 determines that the optical fiber 80 is disconnected. In addition, when, compared with the reference value, the value indicating reflected light decreases with the decrease thereof exceeding the failure detection threshold value, the FPGA 70 determines that a malfunction occurs in the optical output system such as the lens 25, the ferrule 26, or the like.

For example, as illustrated in FIG. 5, when the "failure detection threshold value" is "±5 dBm" and the "reference value" is "−27 dBm", the FPGA 70 executes failure detection as follows. For example, when the value indicating reflected light received by the photo diode 28 is greater than or equal to "−21 dBm", the FPGA 70 determines that the optical fiber 80 is disconnected. In addition, when the value indicating reflected light received by the photo diode 28 is less than or equal to "−33 dBm", the FPGA 70 determines that a malfunction occurs in the optical output system such as the lens 25, the ferrule 26, or the like.

In addition, when detecting the disconnection of the optical fiber 80 or the malfunction of the optical output system, the FPGA 70 controls the output device 30 so that the output device 30 generates an alarm. For example, depending upon whether the optical fiber 80 is disconnected or a malfunction occurs in the optical system, the FPGA 70 controls the output device 30 so that the output device 30 generates a different alarm. Namely, on the basis of the alarm output from the output device 30, the operator of the optical transmission device 10 according to the second embodiment may distinguish the disconnection of the optical fiber from the malfunction of the optical system.

Next, there will be described on each of the procedures of a processing operation performed in the laser module 20 and a processing operation performed in the optical transmission device 10 according to the second embodiment in this order.

[Procedure of Failure Detection Processing Operation Performed in Laser Module According to Second Embodiment]

Figure 7:
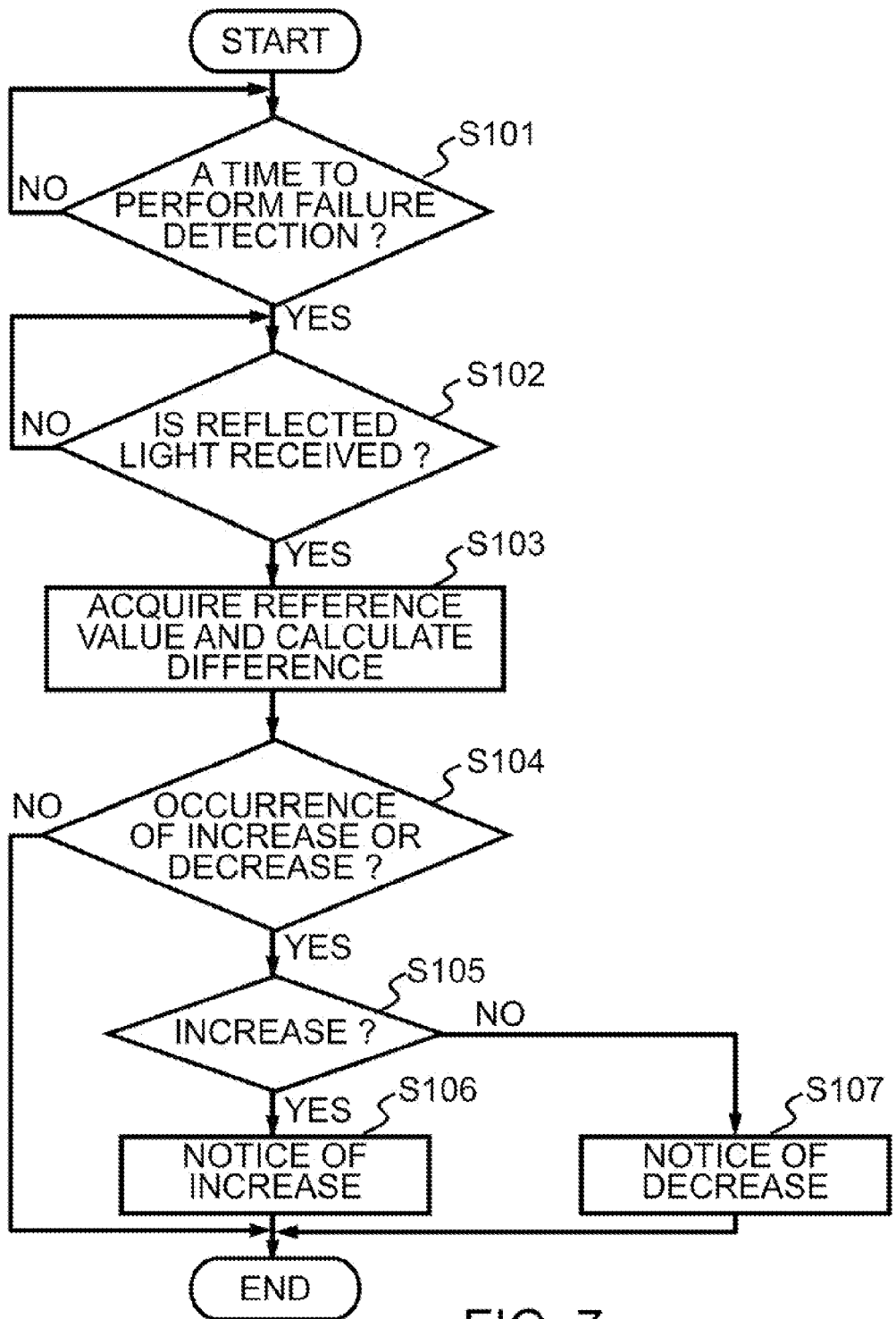
FIG. 7 is a diagram illustrating a procedure of a failure detection processing operation performed in a laser module according to the second embodiment.

FIG. 7 is a diagram illustrating the procedure of a failure detection processing operation performed in the laser module 20 according to the second embodiment. As illustrated in FIG. 7, in the laser module 20 according to the second embodiment, when a current time is a time to perform failure detection (Operation S101: affirmative), first, it is determined whether or not the photo diode 28 has received reflected light (Operation S102). For example, when an operator starts a failure detection processing operation after production, before shipping, or at the time of operation or the like, the laser module 20 according to the second embodiment determines whether or not the photo diode 28 has received reflected light.

When the photo diode 28 receives reflected light (Operation S102: affirmative), the comparator 29 acquires a reference value and calculates a difference (Operation S103). The difference is one between a value indicating the reflected light received by the photo diode 28 and the reference value. Until the photo diode 28 receives the reflected light, the comparator 29 is in a standby state (Operation S102: negative).

Then, the comparator 29 determines whether or not the increase or decrease of the reflected light occurs (Operation S104). When it is determined that the increase or decrease of the reflected light occurs (Operation S104: affirmative), the comparator 29 determines whether or not the reflected light increases (Operation S105). Here, when it is determined that the reflected light increases (Operation S105: affirmative), the comparator 29 gives notice of the increase (Operation S106), and terminates the processing operation.

On the other hand, when it is determined that the reflected light does not increase (Operation S105: negative), the comparator 29 gives notice of a decrease (Operation S107), and terminates the processing operation. In addition, when it is determined that the increase or decrease of the reflected light does not occur (Operation S104: negative), the laser module 20 terminates the processing operation.

The procedure of the failure detection processing operation described above is one in the case in which the laser module 20 executes the failure detection processing operation when the operator of the laser module 20 starts the failure detection processing operation. However, the present embodiment is not limited to the case but may be applied to a case in which the failure detection processing operation is constantly executed when the laser module 20 is operated, for example.

[Procedure of Reference Value Setting Processing Operation Performed in Optical Transmission Device According to Second Embodiment]

Figure 8:
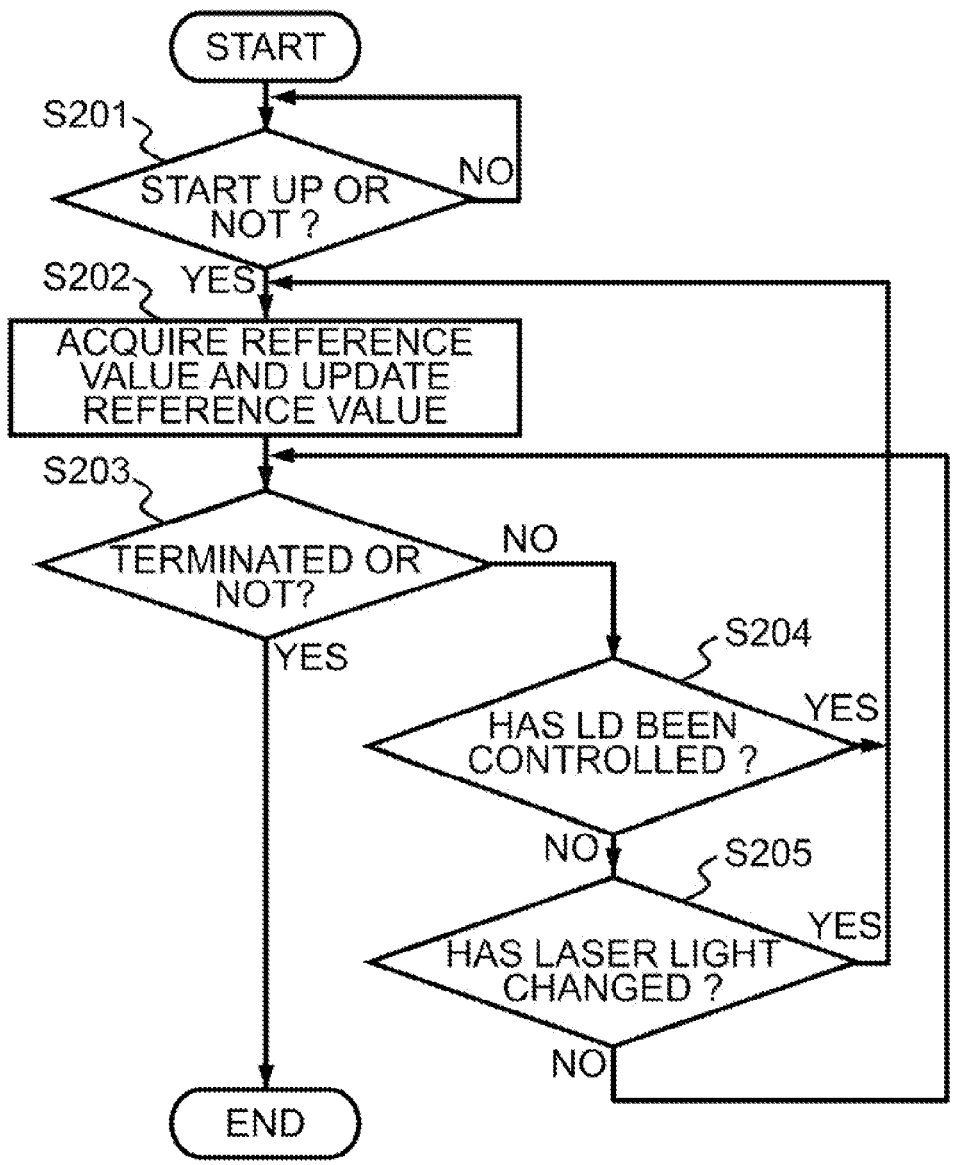
FIG. 8 is a diagram illustrating a procedure of a reference value setting processing operation performed in the optical transmission device according to the second embodiment.

FIG. 8 is a diagram illustrating a reference value setting processing operation performed in the optical transmission device 10 according to the second embodiment. As illustrated in FIG. 8, when the optical transmission device 10 is started up (Operation S201: affirmative), the FPGA 70 acquires a reference value and updates a reference value to the acquired reference value (Operation S202). Specifically, when the optical transmission device 10 is started up, the FPGA 70 acquires a reference value from the reflected light received by the photo diode 28, and updates a reference value stored in the ROM memory 50 to the acquired reference value. In addition, until being started up, the optical transmission device 10 is in a standby state (Operation S201: negative).

Then, it is determined whether or not the optical transmission device 10 has been terminated (Operation S203). Here, when the optical transmission device 10 has been terminated (Operation S203: affirmative), the optical transmission device 10 terminates the reference value setting processing operation. On the other hand, when the optical transmission device 10 has not been terminated (Operation S203: negative), the FPGA 70 determines whether or not the laser diode 21 has been controlled (Operation S204). Specifically, the FPGA 70 determines whether or not the laser diode controller 40 has controlled the output level of the laser diode 21.

When the laser diode 21 has been controlled (Operation S204: affirmative), the FPGA 70 acquires a reference value from the reflected light received by the photo diode 28, and updates a reference value stored in the ROM memory 50 to the acquired reference value (Operation S202). On the other hand, when the laser diode 21 has not been controlled (Operation S204: negative), the FPGA 70 determines whether or not the laser light has changed (Operation S205).

Specifically, the FPGA 70 compares a value indicating the laser light received by the photo diode 28 with the back monitor value stored in the ROM memory 50, and determines whether or not the value indicating the laser light is different from the back monitor value. When the laser light has changed (Operation S205: affirmative), the FPGA 70 acquires a reference value from the reflected light received by the photo diode 28, and updates a reference value stored in the ROM memory 50 to the acquired reference value (Operation S202).

On the other hand, when the laser light has not changed (Operation S205: negative), the FPGA 70 determines whether or not the optical transmission device 10 has been terminated (Operation S203). In addition, the determination operations performed in Operation S204 and Operation S205 are executed in parallel.

[Procedure of Failure Detection Processing Operation Performed in Optical Transmission Device According to Second Embodiment]

Figure 9:
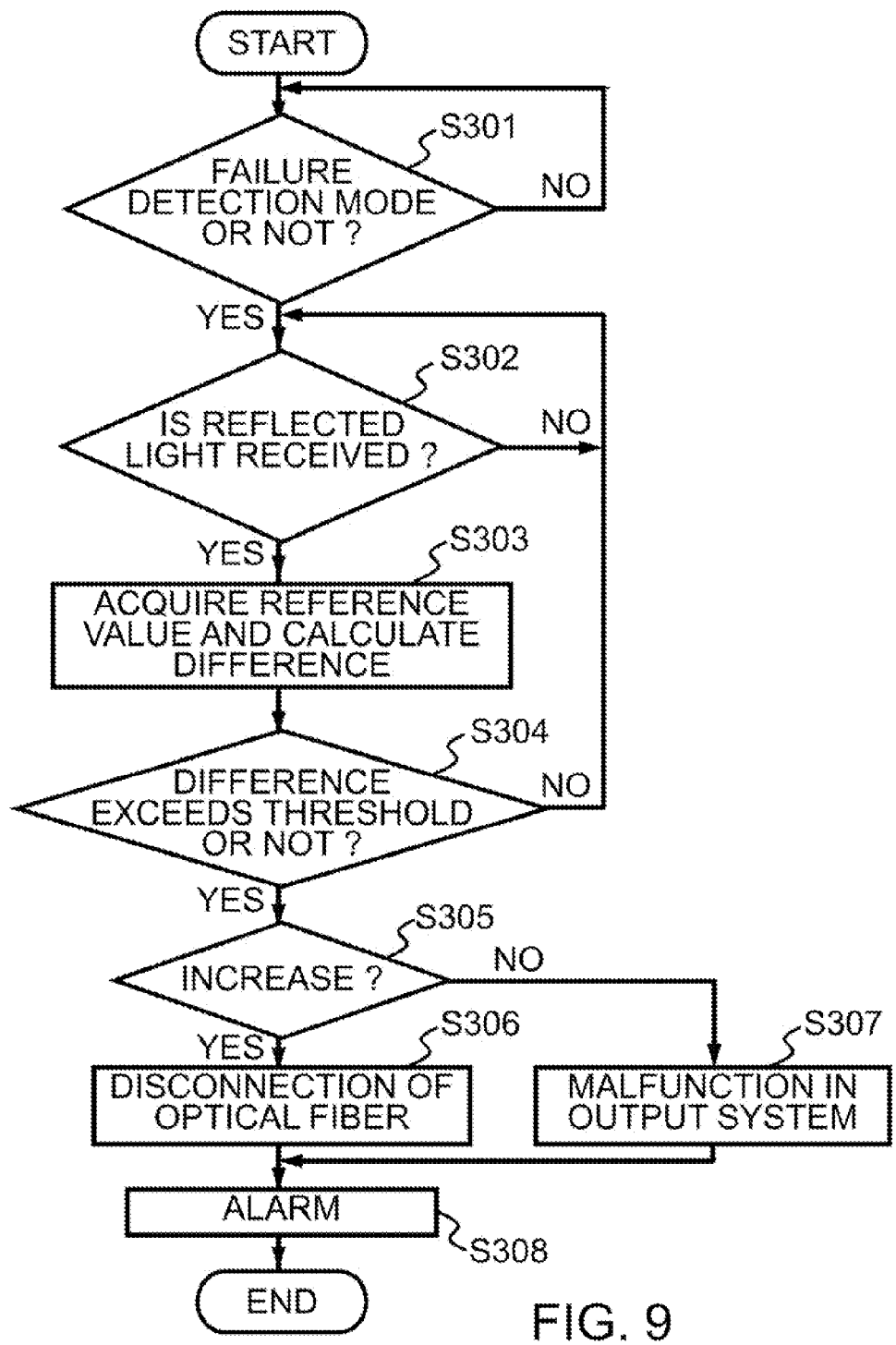
FIG. 9 is a diagram illustrating a procedure of a failure detection processing operation performed in the optical transmission device according to the second embodiment.

FIG. 9 is a diagram illustrating the procedure of a failure detection processing operation performed in the optical transmission device 10 according to the second embodiment. As illustrated in FIG. 9, in the optical transmission device 10, when the optical transmission device 10 is in a failure detection mode (Operation S301: affirmative), it is determined whether or not the photo diode 28 has received the reflected light (Operation S302). For example, in a failure detection mode set by the operator, the optical transmission device 10 determines whether or not the photo diode 28 has received the reflected light.

When the photo diode 28 has received the reflected light (Operation S302: affirmative), the FPGA 70 acquires a reference value and calculates a difference (Operation S303). Specifically, the FPGA 70 calculates a difference between a value indicating the reflected light received by the photo diode 28 and a reference value stored in the ROM memory 50. In addition, until the photo diode 28 receives the reflected light, the FPGA 70 is in a standby state (Operation S302: negative).

Processing moves to Operation S304 in which the FPGA 70 determines whether or not the difference exceeds a failure detection threshold value (Operation S304). That is, the FPGA 70 determines whether or not the calculated difference exceeds a failure detection threshold value stored in the ROM memory 50. Here, when it is determined that the difference exceeds the threshold value (Operation S304: affirmative), the FPGA 70 determines whether or not the reflected light increases (Operation S305).

When it is determined that the reflected light increases (Operation S305: affirmative), the FPGA 70 determines that the optical fiber is disconnected (Operation S306), and causes an alarm indicating the disconnection of the optical fiber to be output from the output device 30 (Operation S308). On the other hand, when it is determined that the reflected light does not increases (Operation S305: negative), the FPGA 70 determines that a malfunction occurs in the output system (Operation S307), and causes an alarm indicating the malfunction of the output system to be output from the output device 30 (Operation S308).

When the difference between the value indicating the reflected light and the reference value does not exceed the threshold value (Operation S304: negative), the processing moves to Operation S302 to stand by until receiving the reflected light. The explained procedure of the failure detection processing operation is performed by the optical transmission device 10 in the failure detection mode. However, the present embodiment is not limited to the case but may be applied to a case in which the failure detection processing operation is constantly executed when the optical transmission device 10 is started up, for example.

As described above, according to the second embodiment, the laser diode 21 emits light in the direction of the optical fiber, and the end face of the optical fiber 80, the polishing angle of which is adjusted, or the lens 25, the reflectance of the antireflection film of which is adjusted, reflects a part of the light emitted from the laser diode 21. In addition, the photo diode 28 receives the reflected light reflected from the direction of the optical fiber 80. In addition, the comparator 29 detects a failure based on a difference between a value indicating reflected light received by the photo diode 28 and a reference value indicating light thought to be reflected when the optical transmission device 10 normally functions. Accordingly, in the laser module 20 according to the second embodiment, the decrease of the reflected light due to the misalignment of the ferrule 26, the lens 25, or the like may be detected. In addition, in the laser module 20 according to the second embodiment, the increase of reflected light due to the disconnection of the optical fiber may be detected. Namely, in the laser module 20 according to the second embodiment, the malfunction of the optical output system and the disconnection of the optical fiber may be detected.

Further, according to the second embodiment, the laser diode 21 emits light in the direction of the optical fiber 80, and the end face of the optical fiber 80, the polishing angle of which is adjusted, or the lens 25, the reflectance of the antireflection film of which is adjusted, reflects a part of the light emitted from the laser diode 21. In addition, the photo diode 28 receives the reflected light reflected from the direction of the optical fiber 80. In addition, the FPGA 70 detects a failure based on a difference between a value indicating reflected light received by the photo diode 28 and a reference value indicating light thought to be reflected when the optical transmission device 10 normally functions. Accordingly, in the optical transmission device 10 according to the second embodiment, the decrease of the reflected light due to the misalignment of the ferrule 26, the lens 25, or the like may be detected. In addition, in the optical transmission device 10 according to the second embodiment, the increase of reflected light due to the disconnection of the optical fiber may be detected. Namely, in the optical transmission device 10 according to the second embodiment, the malfunction of the optical output system and the disconnection of the optical fiber may be detected.

Still further, according to the second embodiment, the ROM memory 50 stores the reference value. In addition, the FPGA 70 detects a failure based on a difference between the value indicating reflected light and the reference value stored in the ROM memory 50. Accordingly, the optical transmission device 10 according to the second embodiment may arbitrarily perform the failure detection.

Further, according to the second embodiment, every time the optical transmission device 10 is started up, the FPGA 70 newly acquires a reference value, and updates the reference value stored in the ROM memory 50 to the newly acquired reference value. In addition, the FPGA 70 detects a failure based on a difference between a value indicating reflected light and the newly updated reference value. Accordingly, the optical transmission device 10 according to the second embodiment may detect a failure in response to the fluctuation of the output of the laser diode 21.

Further, according to the second embodiment, when the output level of the light emitted from the laser diode 21 is changed to an arbitrary output level, the FPGA 70 newly acquires a reference value, and updates the reference value stored in the ROM memory 50 to the newly acquired reference value. In addition, the FPGA 70 detects a failure based on a difference between a value indicating reflected light and the newly updated reference value. Accordingly, the optical transmission device 10 according to the second embodiment may detect a failure in response to the control of the output of the laser diode 21.

Further, according to the second embodiment, the photo diode 22 receives the laser light emitted by the laser diode 21 in the different direction from the optical fiber 80. In addition, when the output level of the laser light received by the laser diode 22 changes, the FPGA 70 newly acquires a reference value, and updates the reference value stored in the ROM memory 50 to the newly acquired reference value. In addition, the FPGA 70 detects a failure based on a difference between a value indicating reflected light and the newly updated reference value. Accordingly, using a technique of the related art, the optical transmission device 10 according to the second embodiment may easily deal with the fluctuation of the output of the laser diode 21.

Further, according to the second embodiment, when, compared with the reference value, the value indicating reflected light increases with the increase thereof exceeding a predetermined threshold value, the FPGA 70 determines that the optical fiber 80 is disconnected. In addition, when, compared with the reference value, the value indicating reflected light decreases with the decrease thereof exceeding a predetermined threshold value, the FPGA 70 determines that a malfunction occurs in the optical output system relating to the output of laser light to the optical fiber 80. Accordingly, the optical transmission device 10 according to the second embodiment may detect a failure in view of the accuracy of the reference value. In addition, the optical transmission device 10 according to the second embodiment may distinguish the disconnection of the optical fiber from the malfunction of the optical system.

[Third Embodiment]

In the second embodiment, the case has been described in which a failure is detected on the basis of whether or not a difference between a value indicating reflected light and a reference value exceeds a failure detection threshold value. In the third embodiment, a case will be described in which a failure is predicted using threshold values set in a phased manner.

[Configuration of Optical Transmission Device According to Third Embodiment]

Figure 10:
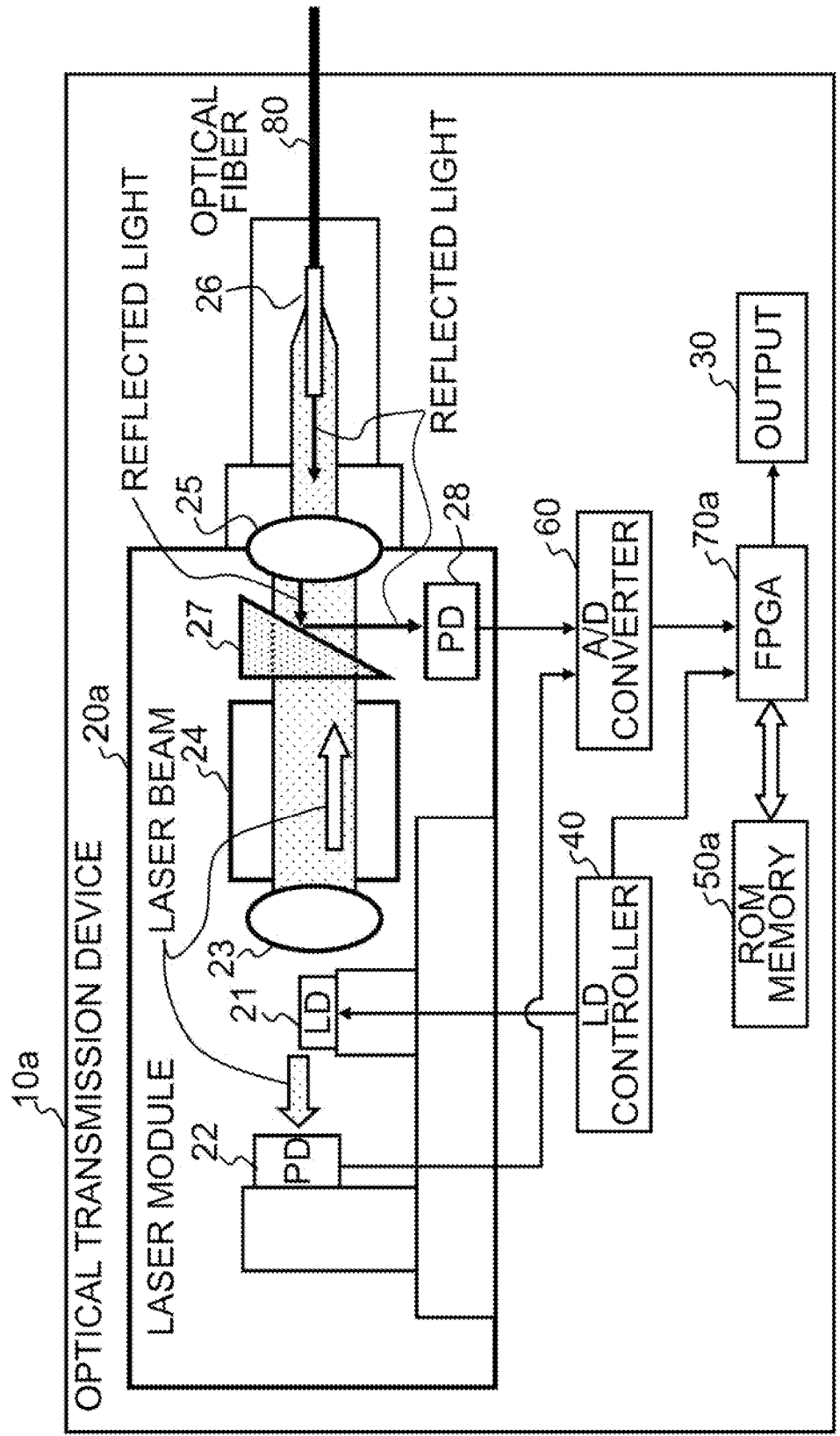
FIG. 10 is a diagram illustrating a configuration of an optical transmission device according to a third embodiment.

First, the configuration of an optical transmission device according to a third embodiment will be described. FIG. 10 is a diagram illustrating the configuration of an optical transmission device 10a according to the third embodiment. As illustrated in FIG. 10, compared with the optical transmission device 10 according to the second embodiment, the optical transmission device 10a differs from the second embodiment in a content stored in a ROM memory 50a and a content of processing performed in an FPGA 70a. Hereinafter, focusing on theses contents, the third embodiment will be described.

Figures 11, 12:
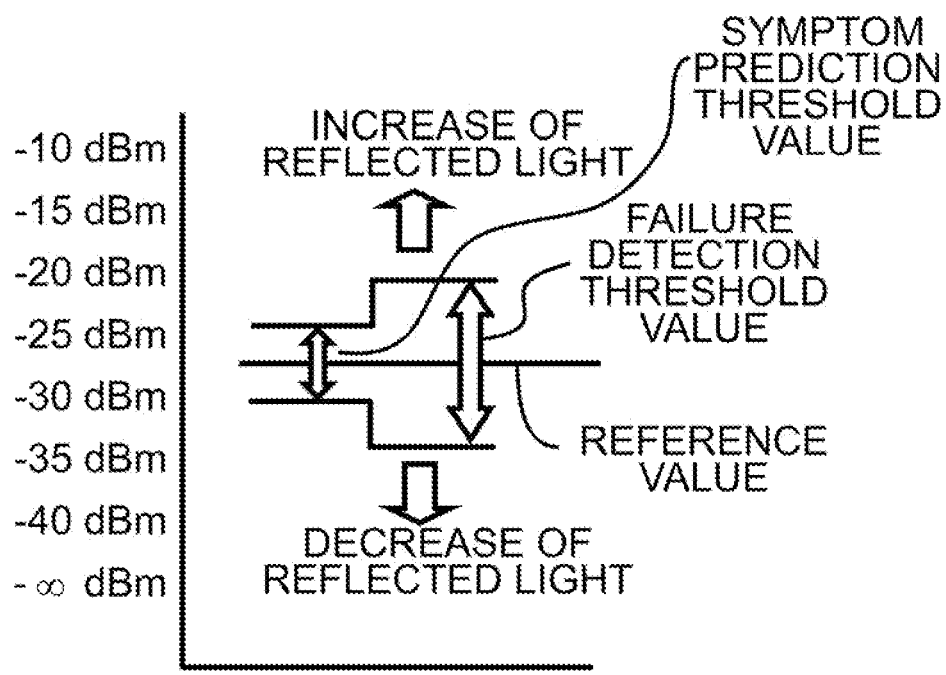
FIG. 11 is a diagram illustrating data stored in a ROM memory according to the third embodiment.
FIG. 12 is a diagram illustrating an FPGA according to the third embodiment.

The ROM memory 50a stores therein each of respective data sets corresponding to a "symptom prediction threshold value", "reference value", a "back monitor value", and a "failure detection threshold value". FIG. 11 is a diagram illustrating the ROM memory 50a according to the third embodiment. A "reference value" illustrated in FIG. 11 means a value indicating reflected light into which reflected light reflected by the lens 25 at a normal operation is combined with reflected light reflected from the end face of the optical fiber 80 jointed by the ferrule 26. A "back monitor value" illustrated means the value indicating laser light output from the laser diode 21 in the opposite direction from the optical fiber 80. A "failure detection threshold value" means a threshold value that the FPGA 70 uses for failure detection. In addition, a "symptom prediction threshold value" means a threshold value that the FPGA 70 uses for the symptom prediction of a failure.

For example, as illustrated in FIG. 11, the ROM memory 50a stores data sets corresponding to "the reference value: −27 dBm, the back monitor value: −20 dBm, the failure detection threshold value: ±5 dBm, and the symptom prediction threshold value: ±3 dBm". Each of the "reference value", the "back monitor value", the "failure detection threshold value", and the "symptom prediction threshold value" illustrated in FIG. 11 are arbitrarily set by the operator.

In a case in which a value indicating the reflected light increases compared with the reference value, when the value of an increase in the value indicating the reflected light lies between a plurality of threshold values set in a phased manner, the FPGA 70a determines that the symptom of the disconnection of the optical fiber is indicated. In addition, when the value of the increase exceeds the plural threshold values, the FPGA 70a determines that the optical fiber is disconnected.

First, there is described on a case in which a value indicating the reflected light decreases compared with the reference value. When the value of a decrease in the value indicating the reflected light lies between a plurality of threshold values set in a phased manner, the FPGA 70a determines that there is the symptom of the occurrence of a malfunction in the optical output system relating to the output of light to the optical fiber. When the value of the decrease exceeds the plural threshold values, the FPGA 70a determines that a malfunction occurs in the optical output system relating to the output of light to the optical fiber.

Specifically, when the value indicating reflected light received by the photo diode 28 exceeds the symptom prediction threshold value stored in the ROM memory 50a and does not exceed the failure detection threshold value, it is determined that the symptom of the occurrence of a failure is indicated. FIG. 12 is a diagram illustrating the relationship among the values such as the reference value and the like which are used for processing by the FPGA 70a.

In FIG. 12, a vertical axis indicates a value of the reflected light, and the horizontal axis indicates a time axis. In addition, a "reference value" illustrated in FIG. 12 means a value indicating reflected light into which the reflected light reflected by the lens 25 at the normal operation is combined with the reflected light reflected from the end face of the optical fiber 80 jointed by the ferrule 26. In addition, a "failure detection threshold value" illustrated in FIG. 12 means a threshold value that the FPGA 70a uses for failure determination. In addition, a "symptom prediction threshold value" illustrated in FIG. 12 means a threshold value that the FPGA 70a uses for symptom determination.

As illustrated in FIG. 12, when, compared with the reference value, the value indicating reflected light increases with the increase thereof exceeding the symptom prediction threshold value and being less than the failure detection threshold value, the FPGA 70a determines that the symptom of the disconnection of the optical fiber is indicated. In addition, when, compared with the reference value, the value indicating reflected light decreases with the decrease thereof exceeding the symptom prediction threshold value and being less than the failure detection threshold value, the FPGA 70a determines that the symptom of the occurrence of a malfunction in the optical output system such as the lens 25, the ferrule 26, or the like is indicated.

For example, as illustrated in FIG. 11, when the "symptom prediction threshold value" is "±3 dBm", the "failure detection threshold value" is "±5 dBm", and the "reference value" is "−27 dBm", the FPGA 70a determines the symptom of a failure as follows. For example, when the value indicating reflected light received by the photo diode 28 is less than or equal to "−22 dBm" and is greater than "−24 dBm", the FPGA 70a determines that the symptom of the disconnection of the optical fiber 80 is indicated. In addition, when the value indicating reflected light received by the photo diode 28 is greater than or equal to "−32 dBm" and is less than "−30 dBm", the FPGA 70 determines that the symptom of the occurrence of a malfunction in the optical output system such as the lens 25, the ferrule 26, or the like is indicated.

When the value indicating reflected light increases with the increase thereof exceeding the failure detection threshold value, the FPGA 70a determines that the optical fiber is disconnected. In addition, when the value indicating reflected light decreases with the decrease thereof exceeding the failure detection threshold value, the FPGA 70 determines that a malfunction occurs in the optical output system such as the lens 25, the ferrule 26, or the like.

When detecting the symptom of the disconnection of the optical fiber 80 or the symptom of the malfunction of the optical output system, the FPGA 70a controls the output device 30 so that the output device 30 generates an alarm. For example, depending upon whether the optical fiber 80 has the symptom of the disconnection thereof or the optical system has the symptom of the occurrence of a malfunction, the FPGA 70a controls the output device 30 so that the output device 30 generates a different alarm. Namely, on the basis of the alarm output from the output device 30, the operator of the optical transmission device 10a according to the third embodiment can predict the disconnection of the optical fiber and the malfunction of the optical output system.

[Procedure of Failure Detection Processing Operation Performed in Optical Transmission Device According to Third Embodiment]

Figure 13:
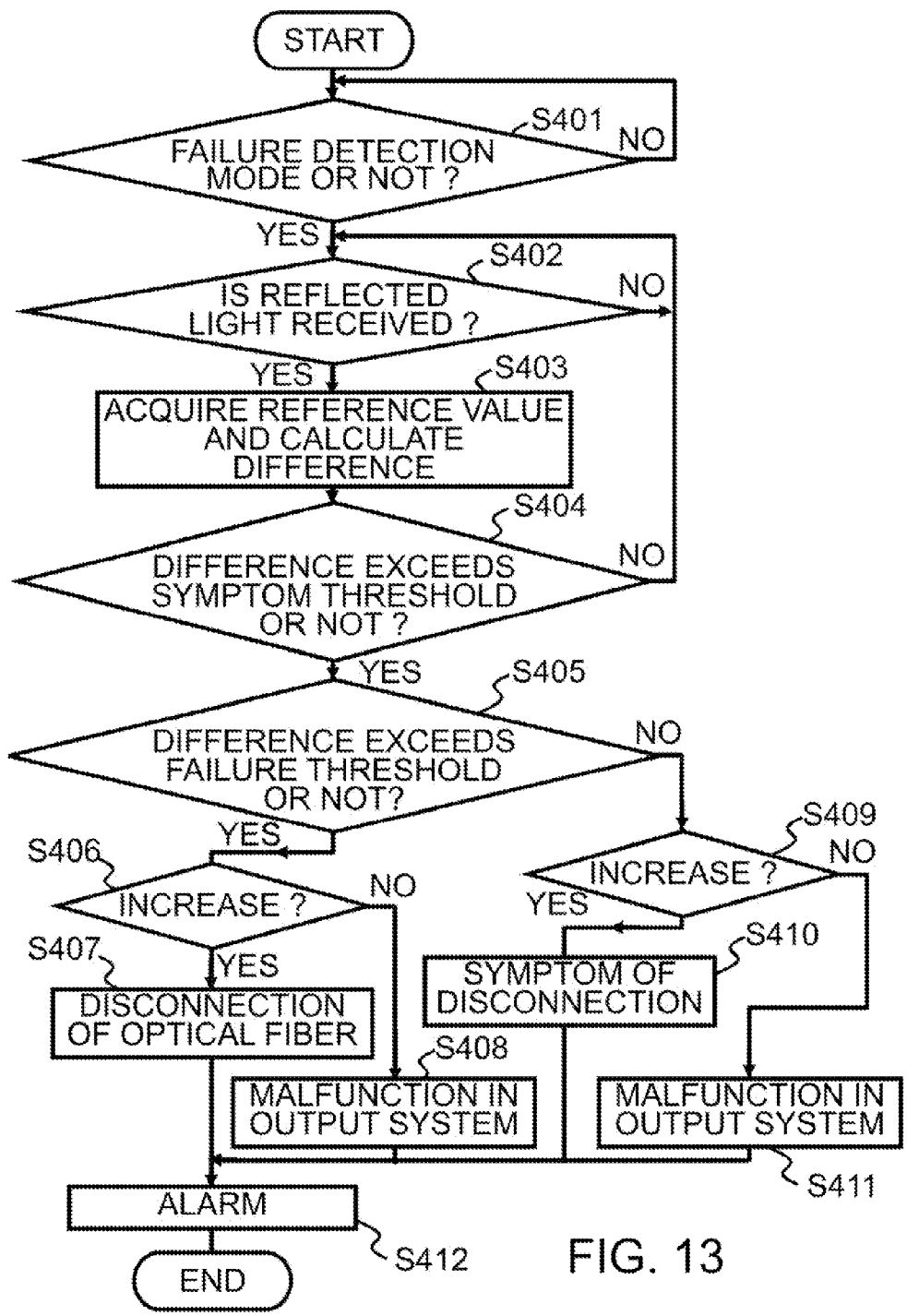
FIG. 13 is a diagram illustrating a procedure of a symptom prediction processing operation performed in the optical transmission device according to the third embodiment.

Next, the procedure of a failure detection processing operation performed in the optical transmission device according to the third embodiment will be described. FIG. 13 is a diagram illustrating the procedure of a failure detection processing operation performed in the optical transmission device 10a according to the third embodiment. Since Operation S401 to Operation S403 illustrated in FIG. 13 are the same as Operation S301 to Operation S303 illustrated in FIG. 9, the detailed descriptions thereof will be omitted. In addition, since Operation S406 to Operation S408 illustrated in FIG. 13 are the same as Operation S305 to Operation S307 illustrated in FIG. 9, the detailed descriptions thereof will be omitted.

As illustrated in FIG. 13, in the optical transmission device 10a, when a difference between the value of reflected light received in a failure detection mode and a reference value is calculated (Operation S401 to Operation S403), the FPGA 70a determines whether or not the difference exceeds a symptom prediction threshold value (Operation S404). Specifically, the FPGA 70a determines whether or not a difference between a value indicating the reflected light received by the photo diode 28 and the reference value exceeds the symptom prediction threshold value stored in the ROM memory 50a.

When it is determined that the difference exceeds the symptom prediction threshold value (Operation S404: affirmative), the FPGA 70a determines whether or not the difference exceeds a failure detection threshold value (Operation S405). Specifically, the FPGA 70a determines whether or not the calculated difference exceeds the failure detection threshold value stored in the ROM memory 50a. Here, when it is determined that the difference exceeds the failure detection threshold value (Operation S405: affirmative), the FPGA 70a determines the disconnection of the optical fiber or the malfunction of the optical output system on the basis of the increase or decrease of the reflected light (Operation S406 to Operation S408). In addition, the FPGA 70a causes an alarm indicating the disconnection of the optical fiber or the malfunction of the optical output system to be output from the output device 30 (Operation S412).

On the other hand, when it is determined that the difference does not exceed the failure detection threshold value (Operation S405: negative), the FPGA 70a determines whether or not the reflected light increases (Operation S409). Here, when it is determined that the reflected light increases (Operation S409: affirmative), the FPGA 70a determines that the symptom of the disconnection of the optical fiber is indicated (Operation S410), and causes an alarm indicating the symptom of the disconnection of the optical fiber to be output from the output device 30 (Operation S412). On the other hand, when it is determined that the reflected light does not increase (Operation S409: negative), the FPGA 70a determines that the symptom of the occurrence of the malfunction of the optical output system is indicated (Operation S411), and causes an alarm indicating the symptom of the occurrence of the malfunction of the optical output system to be output from the output device 30 (Operation S412).

When the difference between the value indicating the reflected light and the reference value does not exceed the symptom prediction threshold value (Operation S404: negative), the processing moves to Operation S402 and the optical transmission device 10a stands by until receiving the reflected light. The procedure of the symptom prediction processing operation described above is performed in a case in which the optical transmission device 10a is in the failure detection mode. However, the present embodiment is not limited to the case but may be applied to a case in which the symptom prediction processing operation is constantly executed when the optical transmission device 10a is started up, for example.

As described above, according to the third embodiment, in a case in which a value indicating the reflected light increases compared with the reference value, when the value of an increase in the value indicating the reflected light lies between a plurality of threshold values set in a phased manner, the FPGA 70a determines that the symptom of the disconnection of the optical fiber 80 is indicated. In addition, when the value of the increase exceeds the plural threshold values, the FPGA 70a determines that the optical fiber 80 is disconnected. In a case in which a value indicating the reflected light decreases compared with the reference value, when the value of the decrease lies between a plurality of threshold values set in a phased manner, the FPGA 70a determines that the symptom of the occurrence of a malfunction in the optical output system relating to the output of laser light to the optical fiber 80 is indicated. In addition, when the value of the decrease exceeds the plural threshold values, the FPGA 70a determines that a malfunction occurs in the optical output system relating to the output of the light to the optical fiber 80. Accordingly, the optical transmission device 10a may detect the disconnection of the optical fiber and the malfunction of the optical output system, and also predict the disconnection of the optical fiber and the malfunction of the optical output system.

[Fourth Embodiment]

As the present invention may be implemented in various kinds of forms different from one another in addition to the first to third embodiments, various kinds of embodiments different from one another will be divided into (1) to (5) and then described.

(1) Reference Value Setting

In the second and third embodiments, the cases have been described in which the FPGA individually updates a reference value at the time of the startup of the optical transmission device, the control of the output of the laser diode, and the change of the laser light received by the photo diode 22. However, the present embodiment is not limited to these cases but may be applied to a case in which, for example, the FPGA updates a reference value at one of the times described above.

(2) Processing Unit

In the second and third embodiments, the cases have been described in which the FPGA is used as a processing unit for performing the failure detection processing operation. However, the present embodiment is not limited to these cases but may be applied to a case in which, for example, an application specific integrated circuit (ASIC) or an electronic circuit such as a central processing unit (CPU), a micro processing unit (MPU), or the like is used.

(3) Memory

In the second and third embodiments, the cases have been described in which the ROM memory is used as a memory for storing data of the reference value. However, the present embodiment is not limited to these cases but may be applied to a case in which, for example, a semiconductor memory element such as a random access memory (RAM), a flash memory, or the like or a storage device such as a hard disk, an optical disk, or the like is used.

(4) System Configuration etc.

Individual configuration elements in the individual devices illustrated in figures are conceptual, and are not necessarily the same as the configuration elements physically illustrated in figures. Namely, the specific embodiments of the distribution and/or integration of each device are not limited to the embodiments illustrated in figures but all or part of each device may be functionally or physically integrated or distributed in arbitrary units according to various loads and various statuses of use. For example, the FPGA 70 and the laser diode controller 40, illustrated in FIG. 4, may be integrated as one control unit. In addition, on the other hand, the ROM memory 50 illustrated in FIG. 4 may be distributed to a reference value memory used for storing the reference value and a threshold value memory used for storing the threshold value.

In addition, among individual processing operations described in the present embodiments, all or part of a processing operation described as a processing operation to be automatically executed may be manually performed. For example, the control of the laser light output from the laser diode 21 illustrated in FIG. 8 may be manually performed. In addition, the FPGA 70 may operate as an external device and be connected to the optical transmission device 10 through a network. In addition, another device may include the FPGA 70, and the other device may be connected to a network and operate in cooperation, thereby realizing the above-mentioned function of the optical transmission device 10. Furthermore, all or part of each processing function performed in each device may be realized using a CPU and a program to be analyzed and executed in the CPU, or realized as hardware based on a hardwired logic.

(5) Failure Detection Program Performed in Laser Module

Figure 14:
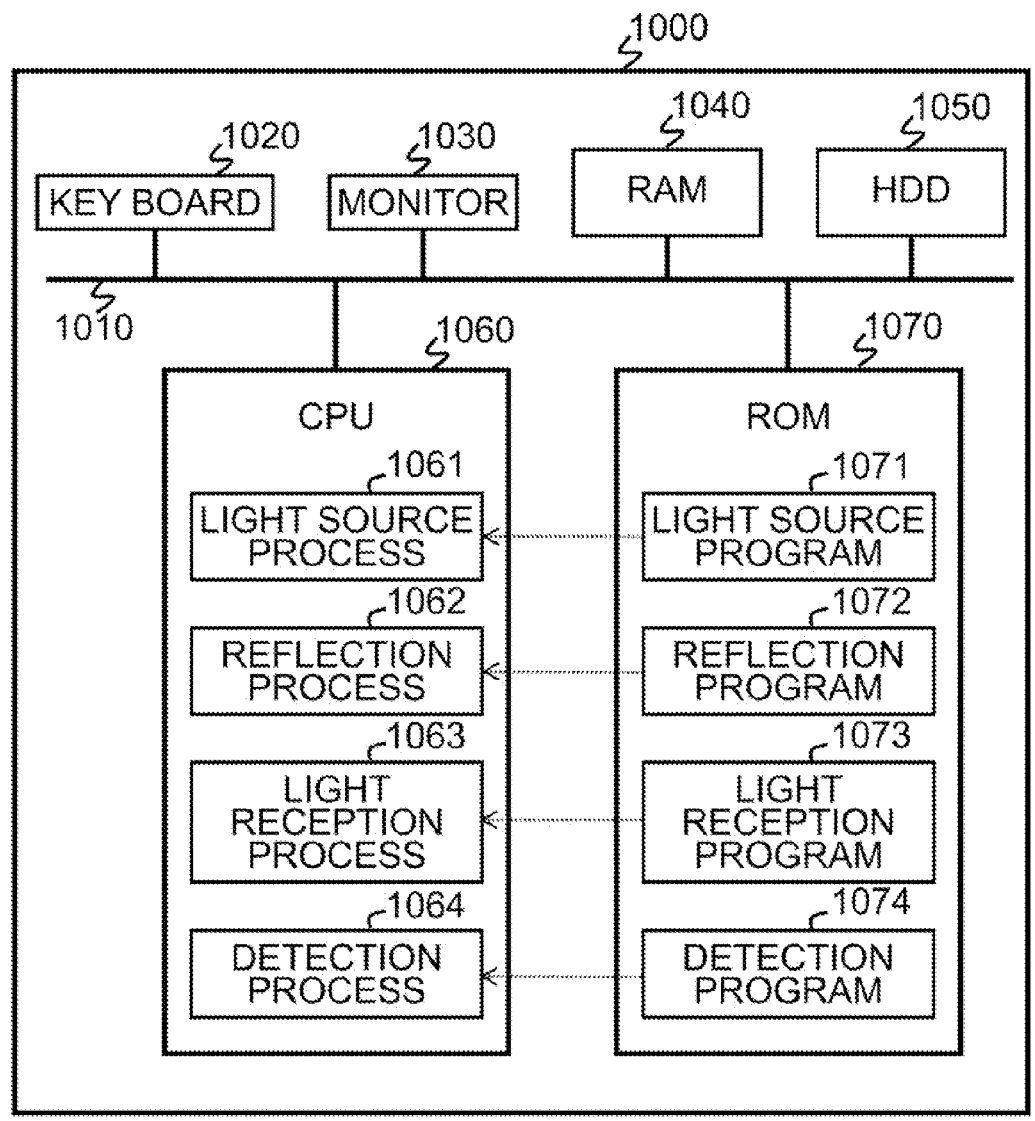
FIG. 14 is a diagram illustrating a computer that executes a failure detection program for a laser module.
Figure 15:
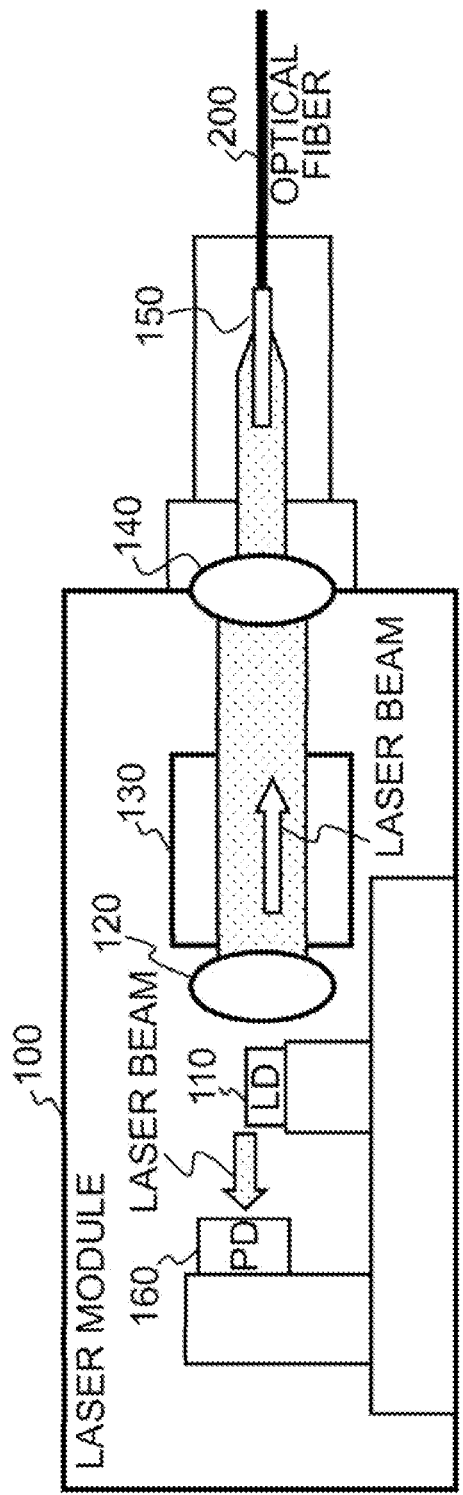
FIG. 15 is a diagram illustrating an example of a laser module of the related art.
Figure 16:
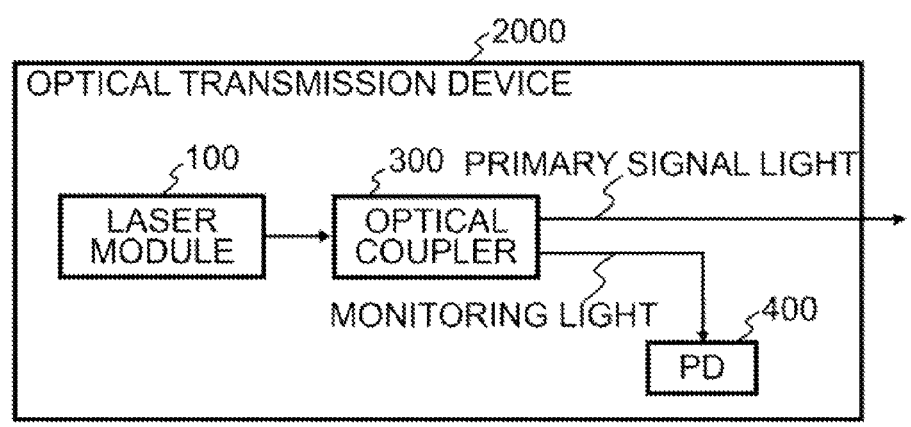
FIG. 16 is a diagram illustrating an example of an optical transmission device of the related art.

In the first embodiment, the case has been described in which various kinds of processing operations are realized using hardware logic, the present embodiment is not limited to the case but may be realized by executing a prepared program in a computer. Therefore, hereinafter, with reference to FIG. 14, an example of a computer will be described that executes a failure detection program for a laser module including the same function as that of the optical transmission device 1 illustrated in the first embodiment described above. FIG. 14 is a diagram illustrating a computer that executes the failure detection program for the laser module.

As illustrated in FIG. 14, a computer 1000 as an information processing device includes a keyboard 1020, a monitor 1030, a RAM 1040, an HDD 1050, a CPU 1060, and a ROM 1070. In addition, the keyboard 1020, the monitor 1030, the RAM 1040, the HDD 1050, the CPU 1060, and the ROM 1070 are connected to one another through a bus 1010.

In the ROM 1070, the failure detection program for the laser module including the same function as that of the optical transmission device 1 illustrated in the first embodiment described above, namely, as illustrated in FIG. 14, a light source program 1071 and a reflection program 1072 are preliminarily stored. In addition, in the ROM 1070, a light reception program 1073 and a detection program 1074 are preliminarily stored. In addition, these programs 1071 to 1074 may be arbitrarily integrated or distributed in the same way as individual configuration elements in the optical transmission device 1 illustrated in FIG. 1.

In addition, the CPU 1060 reads out and executes these programs 1071 to 1074 from the ROM 1070, and hence these programs turn out to function as individual processes as illustrated in FIG. 14. Namely, a light source process 1061, a reflection process 1062, a light receiving process 1063, and a detection process 1064 turn out to function. In addition, the processes 1061 to 1064 correspond to the optical source 2, the reflector 3, the photo receiver 4, and the detector 5, respectively.

In addition, it is not necessary to store the individual programs 1071 to 1074 in the ROM 1070 from the beginning but the individual programs 1071 to 1074 may be stored in another storage medium or another storage device, and be read out and executed by the computer 1000. For example, the other storage medium or the other storage device means a "portable physical medium" such as a flexible disk (FD), a CD-ROM, an MO disk, a DVD disk, a magneto optic disk, an IC card, or the like, which is inserted to the computer 1000. In addition, for example, the other storage medium or the other storage device means a "fixed physical medium" such as an HDD or the like, which is provided in or out of the computer 1000. In addition, the other storage medium or the other storage device means "another computer (or a server)" connected to the computer 1000 through a public line, Internet, a LAN, a WAN, or the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An optical transmission device capable of being coupled to an optical fiber, comprising:
    a light source configured to emit a first light toward the optical fiber;
    a lens configured to converge the first light to an end of the optical fiber;
    a light reflector configured to reflect a first reflected light as a second reflected light, a part of the first light being reflected as the first reflected light by the lens or the optical fiber;
    a first light receiver configured to receive the second reflected light; and
    a detector configured to detect a failure based on a difference value between a first value corresponding to an amount of the second reflected light and a reference value being indicative of an amount of the second reflected light, the second reflected light being detected when the first light is normally emitted and is normally transmitted to and through the optical fiber.

2. The optical transmission device according to claim 1, wherein the lens is coated an antireflective film on a surface thereof to reflect the first light of intensity in a predetermined range.

3. The optical transmission device according to claim 1, wherein the light reflector reflects the first reflected light including a light from the end of the optical fiber, the end being polished at an angle so that the first light is reflected at the end.

4. The optical transmission device according to claim 1, further comprising:
a storage configured to store reference value data corresponding to the reference value, wherein the detector detects the failure based on a difference between the first value and the reference value corresponding to the reference value data.

5. The optical transmission device according to claim 4, further comprising:
an updater configured to acquire the reference value currently determined when the optical transmission device is started up and to update the reference value data with current reference value data corresponding to the reference value currently determined,
wherein the detector detects the failure based on the difference between the first value and the current reference value data.

6. The optical transmission device according to claim 5, wherein
the updater acquires the reference value currently determined when the light emitted from the light source is varied and updates the reference value data with the current data corresponding to the reference value currently determined,
and the detector detects the failure based on the difference between the first value and the current reference value data.

7. The optical transmission device according to claim 5, further comprising:
a second light receiver configured to receive a second light emitted from the light source and to output a second value corresponding to the received second light, the second light being emitted in a direction different from a direction toward the optical fiber,
wherein the updater acquires the reference value currently determined when the second value is varied and updates the reference value data with current data corresponding to the reference value currently determined,
and the detector detects a failure based on a difference between the first value and the current reference value data.

8. The optical transmission device according to claim 1, wherein
the detector determines a disconnection of the optical fiber when the first value is larger than a first higher limit value defined as a sum of the first reference value and a first threshold, and determines an occurrence of a malfunction in an optical output unit when the first value is smaller than a first lower limit value defined as a sum of the reference value and a second threshold, the optical output unit including the light source, the optical fiber, and elements arranged therebetween associated with an propagation of the first light.

9. The optical transmission device according to claim 1, wherein the detector determines a potential disconnection of the optical fiber when the first value is between a first higher limit value and a second higher limit value, the first higher limit value is defined as a sum of the first reference value and a first threshold and the second higher limit value is defined as a sum of the first reference value and a second threshold, and the first higher limit value is lager than the second higher limit value,
wherein the detector determines a disconnection of the optical fiber when the first value is lager than the first higher limit value,
wherein the detector determines a potential occurrence of a malfunction in an optical output unit when the first value is between a first lower limit value and a second lower limit value, the first lower limit value is defined as a sum of the first reference value and a third threshold and the second lower limit value is defined as a sum of the first reference value and a fourth threshold, and the first lower limit value is smaller than the second lower limit value, the optical output unit includes the light source, the optical fiber, and elements arranged therebetween associated with an propagation of the first light, and
wherein the detector determines a occurrence of the malfunction in the optical output unit when the first value is smaller than the first lower limit value.

10. A laser module capable of being optically coupled to an optical fiber, comprising:
a light source configured to emit a first light toward the optical fiber;
a lens configured to converge the first light to an end of the optical fiber;
a light reflector configured to reflect a first reflected light as a second reflected light, the first light being reflected as the first reflected light by the lens or the optical fiber;
a first light receiver configured to receive the second reflected light; and
a detector configured to detect a failure based on a difference value between a first value corresponding to an amount of the second reflected light and a reference value being indicative of an amount of the second reflected light, the second reflected light being detected when the first light is normally emitted and is normally transmitted to and through the optical fiber.

11. The laser module according to claim 10, wherein the lens is coated an antireflective film on a surface thereof to reflect the first light of an intensity in a predetermined range.

12. The laser module according to claim 10, wherein the light reflector reflects the first reflected light including a light from the end of the optical fiber, the end being polished at an angle so that the first light is reflected at the end.

13. A method for detecting a failure in a laser module capable of being optically coupled to an optical fiber, comprising:
emitting a first light, by the laser module, toward the optical fiber;
converging the first light to an end of the optical fiber;
reflecting a first reflected light to a second reflected light, the first light being reflected as the first reflected light by the optical fiber or when the first light propagates in the laser module;
receiving the second reflected light; and
detecting a failure based on a difference value between a first value corresponding to an amount of the second reflected light and a reference value being indicative of an amount of the second reflected light when the first light is normally generated and is normally transmitted to and through the optical fiber.

14. The method according to claim 13, wherein
a lens included in the laser module is arranged on a path along which the first light propagates and the lens includes an antireflective film on a surface thereof to reflect the first light of intensity in a predetermined range.

15. The method according claim 13, wherein
the first reflected light includes a light from the end of the optical fiber, the end being polished at an angle so that the first light is reflected at the end.

16. The optical transmission device according to claim 1, further comprising:
a second light receiver configured to receive light third light from a light source in a direction away from the optical fiber; and
a second detector to detect the third light to monitor the light source.

* * * * *